United States Patent
Ehlert et al.

(10) Patent No.: US 6,800,815 B1
(45) Date of Patent: Oct. 5, 2004

(54) MATERIALS AND STRUCTURE FOR A HIGH RELIABILITY BGA CONNECTION BETWEEN LTCC AND PB BOARDS

(75) Inventors: Michael Richard Ehlert, Irvine, CA (US); William Jeffrey Schaefer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/051,984

(22) Filed: Jan. 15, 2002

Related U.S. Application Data

(60) Provisional application No. 60/262,311, filed on Jan. 16, 2001.

(51) Int. Cl.[7] ............................. H05K 1/11; H01R 12/04
(52) U.S. Cl. ..................... 174/262; 174/255; 174/256; 174/261; 361/767; 257/698
(58) Field of Search ................................. 174/256, 255, 174/262, 264, 260; 361/760, 761, 762, 767, 793, 792, 612, 613; 257/698, 700, 779, 780

(56) References Cited

U.S. PATENT DOCUMENTS

| | | | | |
|---|---|---|---|---|
| 3,077,511 A | * | 2/1963 | Bohrer et al. ............... | 174/265 |
| 4,736,521 A | * | 4/1988 | Dohya ........................... | 29/830 |
| 4,751,349 A | * | 6/1988 | Kim et al. .................... | 174/257 |
| 4,800,459 A | * | 1/1989 | Takagi et al. ............. | 361/321.2 |
| 5,043,223 A | * | 8/1991 | Kumagai et al. ............ | 428/432 |
| 5,329,695 A | * | 7/1994 | Traskos et al. ............... | 29/830 |
| 5,627,344 A | * | 5/1997 | Tanifuji et al. ............... | 174/257 |
| 5,844,782 A | * | 12/1998 | Fukasawa .................... | 361/774 |
| 5,847,326 A | * | 12/1998 | Kawakami et al. ......... | 174/256 |
| 5,855,995 A | * | 1/1999 | Haq et al. .................... | 428/210 |
| 5,937,321 A | * | 8/1999 | Beck et al. .................. | 438/622 |
| 6,205,032 B1 | * | 3/2001 | Shepherd .................... | 361/793 |
| 6,408,511 B1 | * | 6/2002 | Branchevsky ................ | 29/843 |
| 6,528,145 B1 | * | 3/2003 | Berger et al. ............... | 428/156 |

* cited by examiner

Primary Examiner—Kamand Cuneo
Assistant Examiner—J B Patel
(74) Attorney, Agent, or Firm—Beyer Weaver & Thomas, LLP.

(57) ABSTRACT

A ceramic circuit structure comprising a plurality of ceramic layers and at least one electronic component embedded within the plurality of ceramic layers. Within a first one of the ceramic layers is a via that passes through the ceramic layer. A contact pad is formed on a surface of the ceramic layer. A barrier cap is formed between the via and the contact pad. A dielectric ring covers a peripheral portion of the contact pad and an adjacent portion of the dielectric material layer surface immediately surrounding the contact pad, such that any solder that is applied to the contact does not contact the peripheral portion of the contact pad or the ceramic material.

20 Claims, 5 Drawing Sheets

MATERIALS AND STRUCTURE FOR A HIGH RELIABILITY BGA CONNECTION BETWEEN LTCC AND PB BOARDS

CROSS REFERENCE TO RELATED APPLICATION

This application claims benefit of priority under 35 U.S.C. §119(e) of U.S. Provisional Application No. 60/262,311, filed Jan. 16, 2001, which is hereby incorporated by reference.

FIELD OF THE INVENTION

The present invention relates generally to integrated circuit devices, and more specifically, to Low Temperature Co-fire Ceramic Systems.

BACKGROUND

Low Temperature Co-fire Ceramic Systems (LTCC) are a low cost, high performance solution for ceramic packaging of integrated circuit devices. LTCC integrated circuit devices are generally formed of multiple ceramic material layers, within which are embedded electrically conductive pathways and electronic circuit components, such as resistors and capacitors. Typically, ceramics with low dielectric constants are desirable for these applications and highly conductive metals, such as Ag, Cu, and Au, are used as metallization materials. LTCC systems offer excellent dielectric isolation, high layer count circuitry, high performance conductors, and inexpensive processing. These characteristics lead LTCC semiconductor devices to have high densities, reliability, and performance, at low costs. In some applications, semiconductor devices may be electrically mounted onto LTCC integrated circuit modules.

In order to illustrate the structure of an LTCC module in greater detail, FIG. 1 illustrates a side plan, cross-sectional view of a portion 100 of an LTCC module. This module may be for example, a ball grid arrayed type module. This specific LTCC module is formed of four ceramic material layers 102, 104, 106 and 108. Layer 102 is referred to as the bottom layer because it will be adjacent to a printed circuit board (PCB) upon mounting of the LTCC module. Respectively, layer 108 is referred to as the top layer. The electronic components (not shown) within the LTCC module are formed on the surfaces of each ceramic layer. The electronic components on the various layers are then electrically connected to each other through the conductive traces 110 that run along the surface of each layer, and the conductive material that fills the holes or through-holes that pass through the thickness of each layer. The conductive material filling the holes form vias 112. Catch pads 114 are formed at the bottom end of each of the vias 112 to facilitate a solid connection between vias 112 and conductive traces 110 on the lower and adjacent ceramic layer or with contact (or solder) pads 115. Catch pads 114 also make it easier to fill vias 112 with conductive material. It is noted that catch pads 114 facilitate solid connections but are not necessary to form connections between conductive traces 110 and vias 112. Contact (or solder pads) 115 are formed on the bottom surface of layer 102 and are connected to catch pads 114. Contact pads 115 provide a surface onto which solder balls 116 can be formed. Solder balls 116 are used to connect LTCC module 100 to an electronic substrate, such as a printed circuit board.

Even though LTCC modules currently provide a low cost, high performance solution for ceramic packaging of integrated circuit devices, continuing efforts are underway to improve this technology. One area of specific importance relates to the durability of the LTCC modules upon attachment to printed circuit boards. Unfortunately, a problem arises in this circumstance since the coefficient of thermal expansion for LTCC modules is much lower than that of standard printed circuit boards. This results in thermal cycling fatigue due to the relatively large degree of expansion and contraction of the printed circuit board, as compared to that of the LTCC modules. Ultimately, fatigue failure manifests itself when the ceramic material surrounding the contact pads and/or the contact pad cracks and thereby causes contact pads 115 to fall out from the LTCC module. It is noted here that solder balls 116 usually become melded into a contiguous formation with contact pads 115 during the LTCC manufacturing process, and therefore, solder balls 116 separate from the LTCC module together with the contact pads 115. Simply put, such structural failure ends the useful life of an LTCC module.

In view of the foregoing, a solution for increasing the useful life of LTCC integrated circuit modules by strengthening the bond between the contact pads and the ceramic material of the LTCC module would be desirable.

SUMMARY

The present invention is directed to a structural design and a method for forming LTCC integrated circuit modules that exhibit long thermal cycle fatigue lives after being attached to electronic substrates, such as printed circuit boards. The present invention thereby greatly increases the utility and value of LTCC modules. An LTCC module according to one embodiment of the present invention comprises a plurality of ceramic layers and at least one electronic component embedded within the plurality of ceramic layers. Within a first one of the ceramic layers is a hole that passes through the ceramic layer, the hole being filled with a first electrically conductive material to form a via. A contact pad is formed on a surface of the ceramic layer, wherein the contact pad formed from a second electrically conductive material that is different from the first electrically conductive material. A barrier cap is formed between the via and the contact pad, wherein the barrier cap is formed from a third electrically conductive material that is different from the first and second electrically conductive materials. A dielectric ring covers a peripheral portion of the contact pad and an adjacent portion of the dielectric material layer surface immediately surrounding the contact pad, such that any solder that is applied to the contact does not contact the peripheral portion of the contact pad or the ceramic material.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Generally, the present patent application discloses a structural design and a method for forming LTCC integrated circuit modules that exhibit long thermal cycle fatigue lives after being attached to electronic substrates, such as printed circuit boards. The present invention thereby greatly increases the utility and value of LTCC modules.

Figure 1:
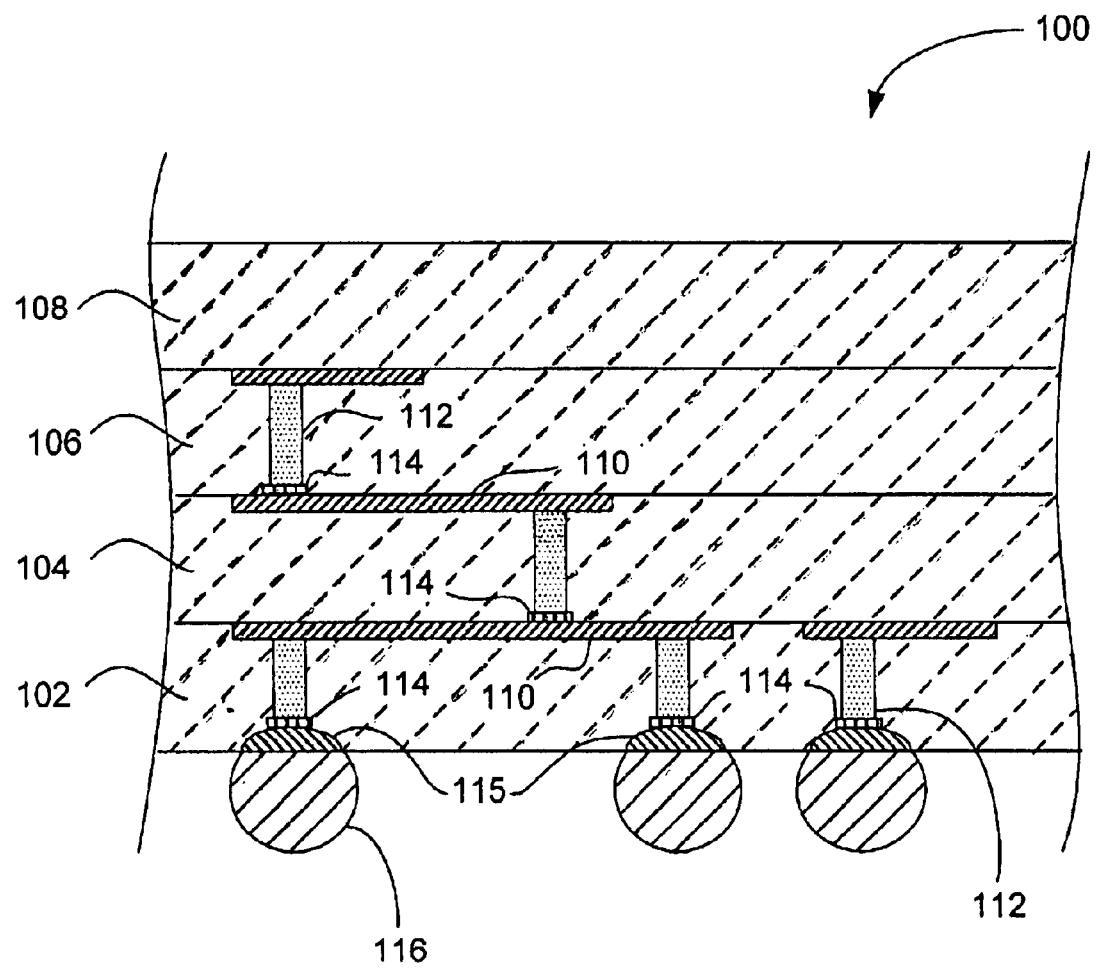
FIG. 1 illustrates a side plan, cross-sectional view of a portion of an LTCC module as is known in the art.
Figure 2A:
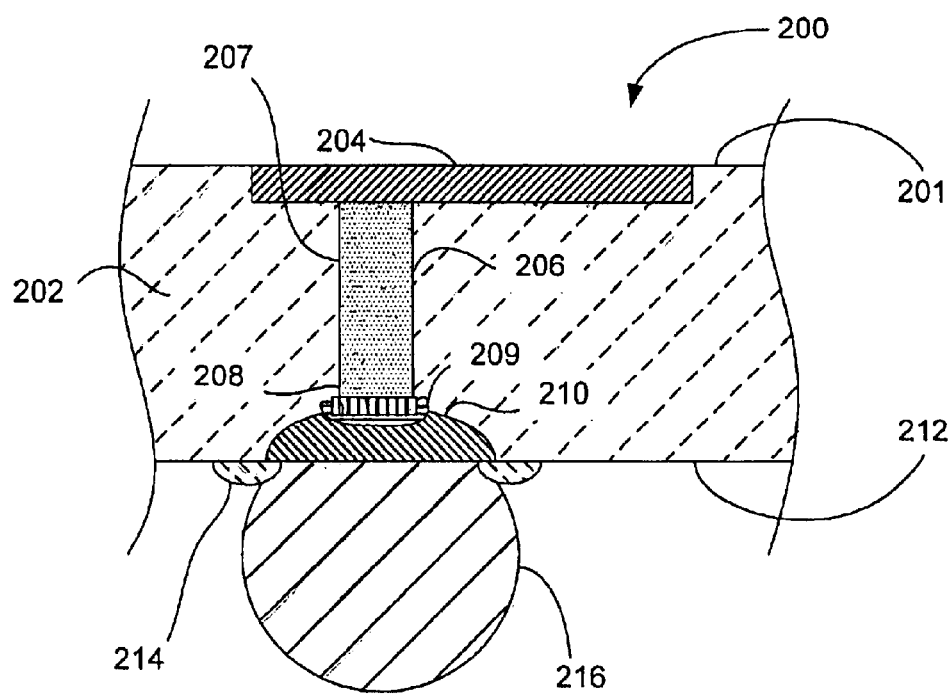
FIG. 2A illustrates a side plan, cross-sectional view of a portion of the bottom ceramic layer of a multi-layered LTCC module according to one embodiment of the present invention.
Figure 2B:
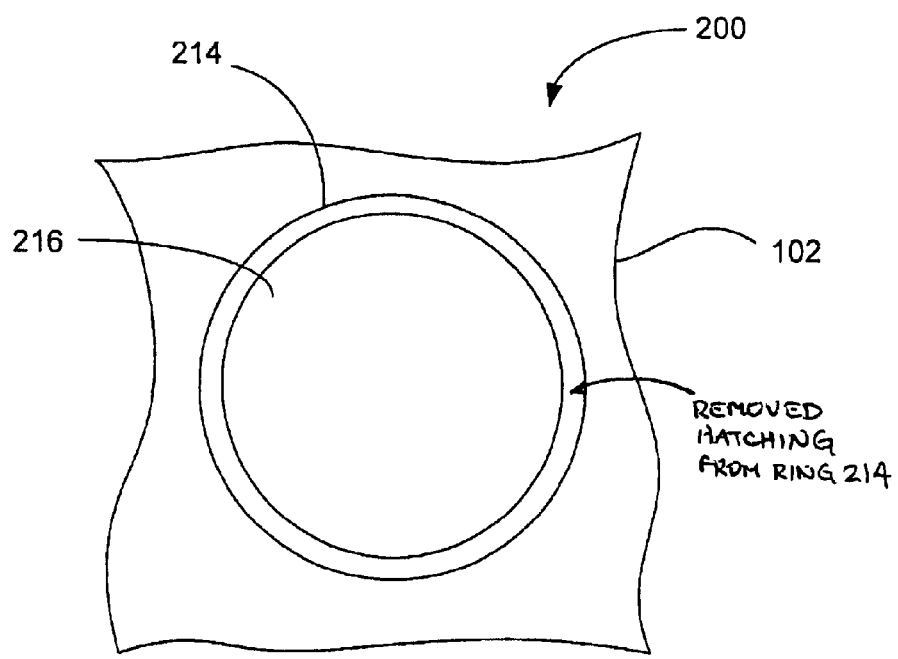
FIG. 2B illustrates a top plan view of the bottom surface of the ceramic layer in FIG. 2A.
Figure 5:
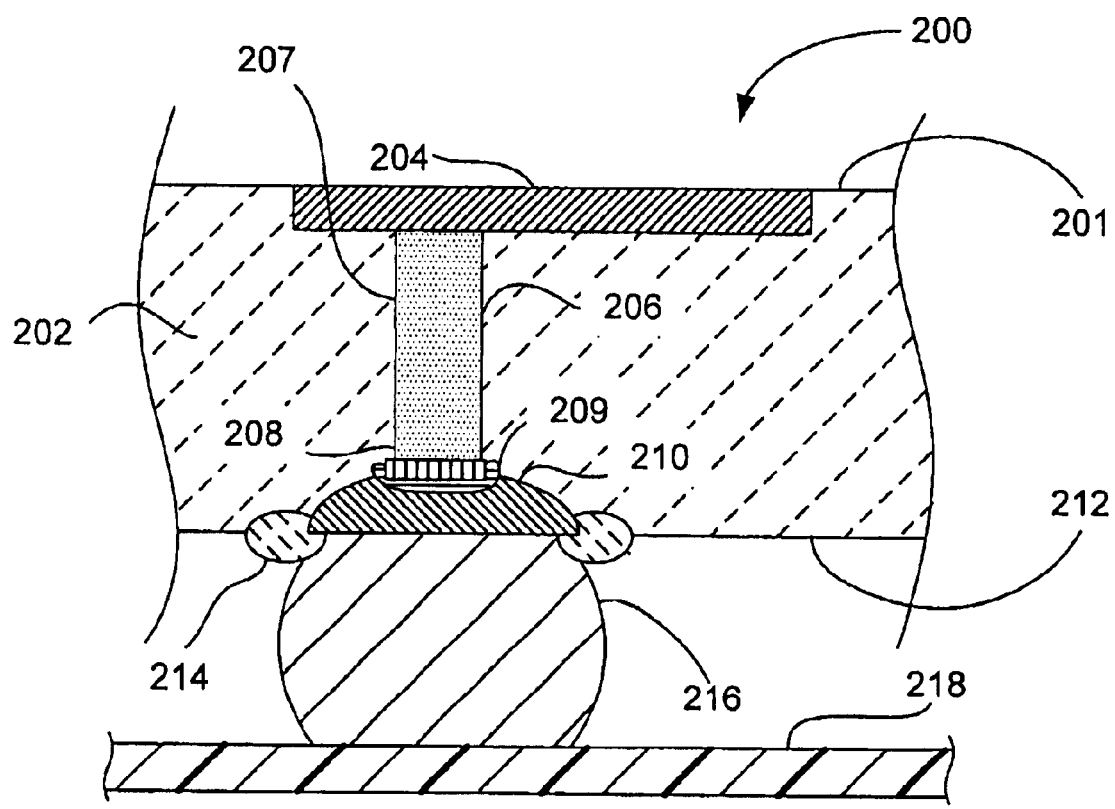
FIG. 5 illustrates a side plan, cross-sectional view of a portion of the bottom ceramic layer of a multi-layered LTCC module according to another embodiment of the present invention.

FIG. 2A is now presented to diagrammatically illustrate the structure of one possible embodiment of the present invention. FIG. 2A is a side plan, cross-sectional view of a portion of the bottom ceramic layer 202 of a multi-layered LTCC module 200. To provide an additional perspective view of the structure, FIG. 2B illustrates a top plan view of the bottom surface 212 of layer 202. As can be seen in FIG. 2A, a conductive trace 204, which is on the upper surface 201 of layer 202, is electrically connected to electrically conductive material within through-hole 206. Through-hole 206 is a passageway that passes through a substantial portion of the layer's thickness. The electrically conductive material within the through-hole 206 forms via 207. At the end of via 207, opposite conductive trace 204, is formed a catch pad 208. A conductive barrier cap 209 is formed in connection to catch pad 208. Barrier cap 209 forms an intermediate conductive material through which catch pad 209 is connected to the material forming contact (or solder) pad 210, which is formed on the bottom surface 212 of layer 202. Barrier cap 209 serves as a barrier that prevents chemical reactions from occurring between the material of via 207 and catch pad 208 with the material of contact pad 210. Layer 202 is typically the bottom layer of a laminate LTCC module. A ring of dielectric material 214 is formed on the bottom surface 212 of layer 202 such that the perimeter of the contact pad 210 and toe portion of the ceramic layer 202 immediately surrounding the contact pad 210 is covered by the ring. Within the ring 214 and on the surface of the contact pad 210 is placed solder material 216. Solder 216 is used to attach the LTCC module 200 to an electronic substrate, such as a printed circuit board 218 (see FIG. 5). It is common to use a lead/tin composite material for the solder material 216. Again, FIG. 2B illustrates a plan view of the bottom surface 212 of layer 202 to provide a greater appreciation for the structural design of the specific embodiment of the present invention. In FIG. 2B, it can be seen that the perimeter of the ring 214 extends beyond the outer surface of the solder material 216. It is, however, not necessary that the outer perimeter of the dielectric ring 214 extend beyond the outer surface of the solder material 216.

Ring 214 is formed of a dielectric material and functions to prevent solder material 216 from making contact with the perimeter of contact pad 210 and the portion of the ceramic material immediately surrounding contact pad 210. Ring 214 may either be formed on top (See FIG. 2A) or be partially embedded within (See FIG. 5) surface 212. Ring 214 increases the structural integrity to the LTCC module after the module has been attached to a printed circuit board in that the thermal cycle fatigue life is increased. In some cases the fatigue life is increased at least five fold over LTCC modules which lack structures such as rings 214. In this embodiment, ring 214 is formed of a glass dielectric ink. Dupont glass dielectric ink #5682, as well as other suitable materials, may be used.

Typically, the outer periphery of contact pads 210 have a thickness that is less than the thickness of the contact pads near the center of the pads. This thickness ratio is a result of the deposition process used to apply the contact pad material onto the ceramic layers of the LTCC modules. One of the ways in which the dielectric ring 214 increases the thermal cycle fatigue life of the LTCC module is by adding to the structural integrity of the module in the peripheral region of the contact pad 210 and the ceramic layer material adjacent to the contact pad 210.

Barrier cap 209 separates and prevents contact between catch pad 208 and contact pad 210. A purpose for the barrier cap 208 is to prevent any type of reactions from occurring between the material of via 207 and catch pad 208 with the material of contact pad 210. Reactions between these respective materials may be induced by the firing operations of the LTCC manufacturing process wherein the LTCC modules are baked under high temperatures. The reactions between the respective materials can be problematic when voids within the conductive pathway between via 207 and contact pad 210 are formed. For instance, voids can form between each of via 207, catch pad 208, and contact pad 210. Such voids create resistance to electrical conduction within the LTCC module and thereby hinder the module's electrical performance. In this particular embodiment, the barrier cap 209 is formed of gold. Dupont conductive gold ink #5742, as well as other suitable materials, can be used to form the barrier cap 209. It should be noted that any electrically conductive material capable of preventing reactions from occurring between via 207, catch pad 208, and barrier cap 210 can also be utilized. Also, in this embodiment, the metal forming the via 207 is palladium-silver, which can be obtained by using Dupont's ink #6138, and metal forming the pad 210 is platinum-gold, which can be obtained by using Dupont's ink 5739. Other materials, as is known in the art, may be utilized for the metal forming via 207 and contact pad 210.

The LTCC module can have inner ceramic layers that also have contact pads that are separated from the vias and the catch pad by a barrier cap. However, contact pads are not necessary in the inner layers since the vias in these layers are connected to conductive traces, and not solder balls. Therefore, in these embodiments, a barrier cap would also be unnecessary.

In one specific embodiment of the present invention, the dielectric ring 214 can have an inner and outer diameter of approximately 39 and 50 mils, respectively, thereby giving the ring a band having a width of approximately 11 mils. Also, in this embodiment, the diameter of the contact pad 210 is approximately 40 mils. It should be understood that various other dimensions embodying this invention are possible and that the above dimensions are only exemplary.

It should be noted that the module 200 discussed in FIGS. 2A and 2B may be a ball grid arrayed type module. However, the structure described in FIGS. 2A and 2B may also relate to other types of multi-layered ceramic modules having vias, contact pads and solder balls.

Figure 3:
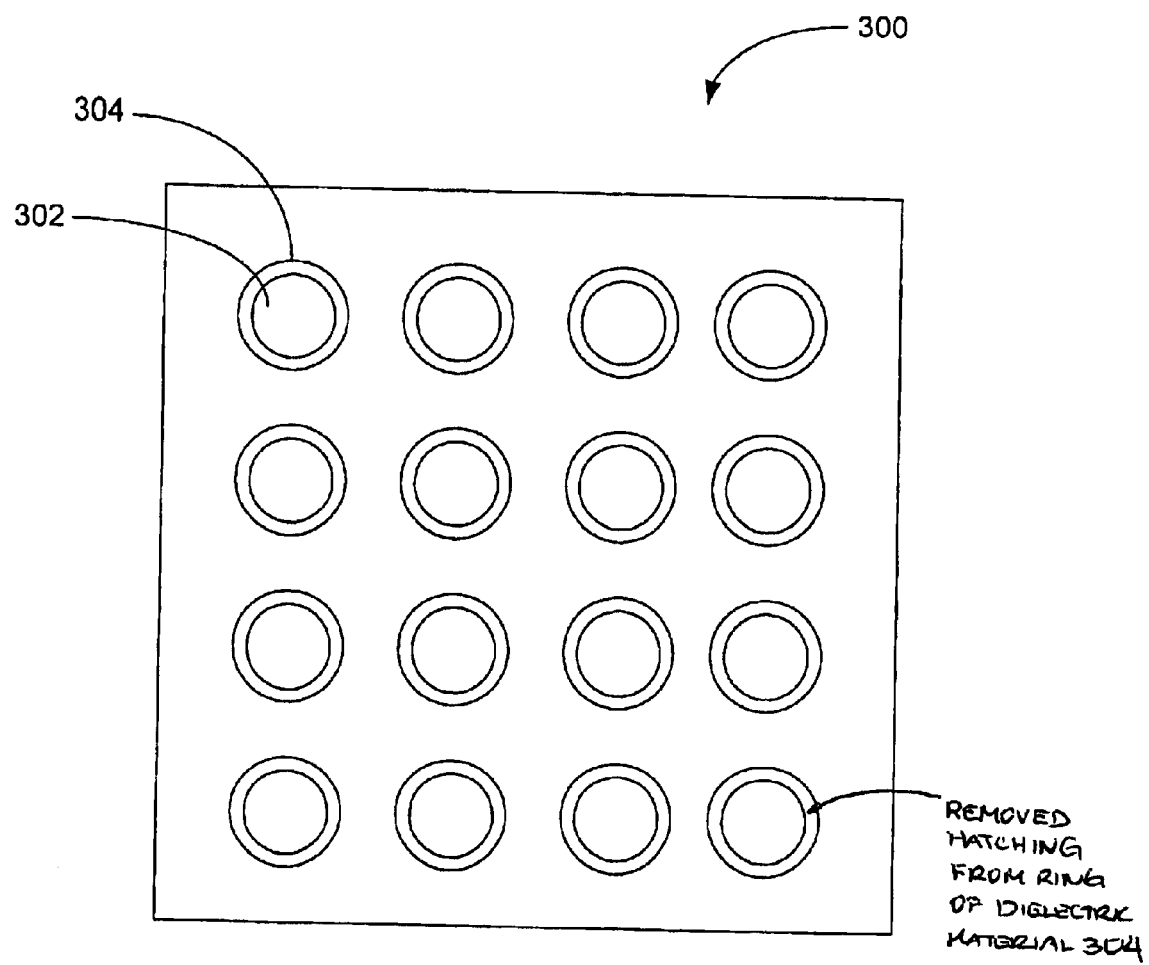
FIG. 3 illustrates a plan view of the bottom surface of one embodiment of a ball grid arrayed LTCC module, according to the present invention.

FIG. 3 illustrates a plan view of the bottom surface of one embodiment of a ball grid arrayed LTCC module 300, according to the present invention. On the bottom surface of the module 300 is an array of solder balls 302, each of which is formed within a ring of dielectric material 304. LTCC module 300 can provide the circuitry required for a variety of applications, such as for cellular telephones.

Figure 4:
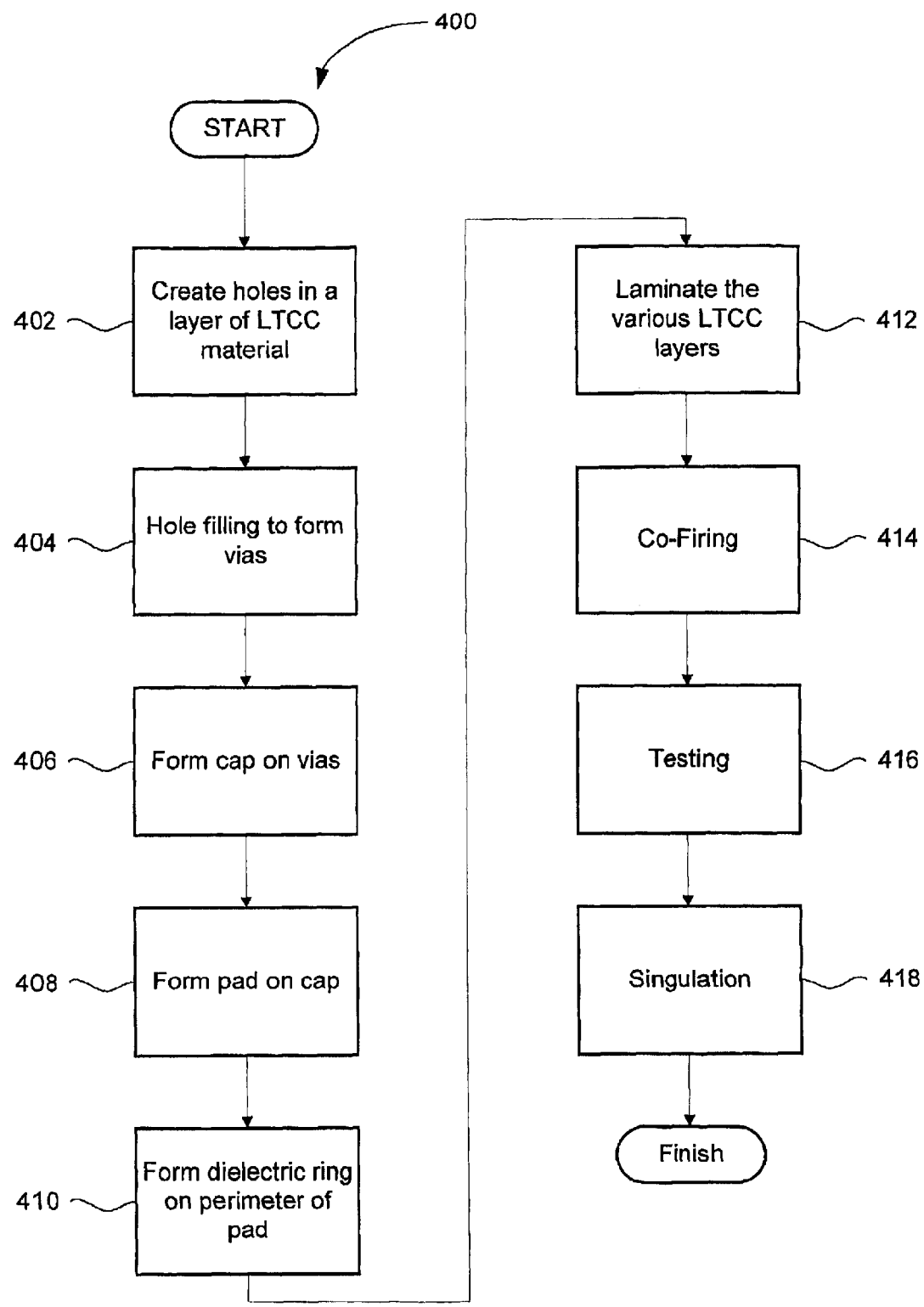
FIG. 4 illustrates a flow diagram representing an exemplary process for forming an LTCC module according to the present invention.

FIG. 4 illustrates a flow diagram representing an exemplary process 400 for forming the LTCC module of the present invention. The illustrated process can be, and is preferably, performed in parallel such that multiple layers of the module may be processed simultaneously.

As represented in block 402, LTCC manufacturing processes generally begin by creating holes, or through-holes, in each of the layers that will ultimately form the LTCC module. Such holes can be formed by various techniques such as mechanical punching or laser cutting. It should be noted that these holes are created for various purposes in addition to providing electrical pathways. For example, the holes can also serve as "tooling holes" for registration at a lamination step (see below), and "registration holes" for automatic vision systems used in the manufacturing process.

After the holes for electrical pathways are created, vias are created by filling the holes with material that can conduct electricity. Hole filling, as represented in block 404, can be performed using a conventional thick film screen printer or extrusion via filler or other methods. Generally, the metalization inks are specially formulated to solidly fill the holes such that the ink shrinkage matches to the tape. In this specific process, palladium-silver (Pd—Ag), DuPont ink #6138 is used, however, other suitable materials can also be used. Catch pads are typically formed on the bottom end of the holes at the same time that the holes are filled with conductive material.

Next, as represented in block 406, barrier caps are formed at one end of the vias such that they are connected to the bottom surface of the catch pads. The barrier cap is important in that it prevents the palladium-silver material forming the vias and the material forming the catch pads from chemically interacting with the platinum-gold material of the contact pads. In block 408, after the barrier caps are formed, metal is deposited upon the caps so to form contact pads.

In block 410, the dielectric rings are formed on the perimeter of the contact pads on the ceramic material layer that will be used as the bottom layer for the ultimate LTCC module. As discussed above, the dielectric rings are formed such that the width of the rings cover the outer perimeter of the pads and a portion of the LTCC layer surrounding the pads. Of course, it is possible to form the dielectric rings such that they are completely supported by the contact pads, such that the rings do not come in contact with the ceramic material layer.

To form the LTCC module, the various layers that will form the module must be aligned and stacked on top of each other. This process, represented in block 412, is referred to as "lamination." The first step in laminating the various layers is to align the layers. For instance, this may be done by properly positioning the "tooling holes" over tooling pins. After the layers have been stacked, the layers are then pressed and heated. The pressing may be accomplished through hydraulic presses or through isostatic lamination, which presses the layers together using heated water. Of course, there may be other methods of completing the lamination process.

Generally, the application of pressure during the lamination process causes the initial configuration of the materials deposited to form the LTCC layers to change. For instance, it is common that the material deposited to form the contact pads initially rises above the surface of the ceramic layers. However, after the application of pressure, the contact pad material is usually pressed into the surface of the ceramic layers such that a surface of the contact pad is approximately flush with the surface of the ceramic layers. Also, the dielectric rings may be pressed such that they are partially embedded into the surface of the ceramic layers. Usually, the dielectric rings rise above the surface of the ceramic layers. It should be appreciated that the application of pressure during the LTCC manufacturing process can occur at stages other than the lamination step.

Following lamination, the laminated LTCC layers are heated in a co-firing process. This process is represented in block 414. The layers are usually soaked in relatively high temperatures for short period of time to obtain proper adhesion. LTCC systems are usually fired at approximately 850° C.

Block 416 shows that after co-firing, the sheets of laminate LTCC are generally tested for electrical performance. For instance, detection is performed for open and short circuits. After testing, block 418 shows that the laminate LTCC sheets are singulated into individual electrical modules. In alternative embodiments of the invention, singulation can also take place at any time after lamination block 412. Singulation may be performed through various methods as known in the art. For instance, sawing with a heated or non-heated blade, ultrasonic, laser, and punching methods can be used.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A ceramic circuit structure having a plurality of ceramic layers, wherein a first one of the ceramic layers comprises:

a through-hole that passes through the first ceramic layer, the through-hole being filled with a first electrically conductive material, which forms a via;

a contact pad formed on a surface of the first ceramic layer, the contact pad formed from a second electrically conductive material that is different from the first electrically conductive material;

a barrier cap formed in contact with and between the via and the contact pad such that the barrier cap is encapsulated within the first ceramic layer, the barrier cap being formed from a third electrically conductive material that is different from the first and second electrically conductive materials; and a dielectric ring covering a peripheral portion of the contact pad and an adjacent portion of the dielectric material layer surface immediately surrounding the contact pad, such that any solder that is applied to the contact does not contact the peripheral portion of the contact pad or the ceramic material.

2. A ceramic circuit structure as recited in claim 1 wherein the barrier cap is configured to prevent the first electrically conductive material within the through-hole from making contact with the second electrically conductive material forming the contact pad.

3. A ceramic circuit structure as recited in claim 1 wherein the ring of dielectric material is formed of glass.

4. A ceramic circuit structure as recited in claim 1 wherein the ring of dielectric material is partially embedded within the surface of the first ceramic layer.

5. A ceramic circuit structure as recited in claim 1 wherein the ceramic circuit structure is mounted onto a printed circuit board, and wherein the first ceramic layer of the plurality of ceramic layers is directly adjacent to the printed circuit board.

6. A ceramic circuit structure as recited in claim 1 wherein the contact pad is embedded within the surface of the first ceramic layer such that a surface of the contact pad is flush with the surface of the first ceramic layer.

7. A ceramic circuit structure as recited in claim 1 wherein the first electrically conductive material filling the through-hole is palladium-silver, the second electrically conductive material forming the contact pad is platinum-gold, and the third electrically conductive material forming the barrier cap is gold.

8. A ceramic circuit structure as recited in claim 1, further comprising:
a solder ball formed within the dielectric ring.

9. A ceramic circuit structure having a plurality of ceramic layers, wherein a first one of the ceramic layers comprises:
a through-hole that passes through the first ceramic layer, the through-hole being filled with a first electrically conductive material, which forms a via;
a catch pad formed at one end of the via;
a contact pad embedded within a surface of the first ceramic layer such that a surface of the contact pad is flush with the surface of the first ceramic layer, the contact pad formed from a second electrically conductive material that is different from the first electrically conductive material; and
a barrier cap formed in contact with and between the catch pad and the contact pad such that the barrier cap is encapsulated within the first ceramic layer, the barrier cap being formed from a third electrically conductive material that is different from the first and second electrically conductive materials.

10. A ceramic circuit structure having as recited in claim 9 further comprising:
a dielectric ring covering a peripheral portion of the contact pad and an adjacent portion of the dielectric material layer surface immediately surrounding the contact pad, such that any solder that is applied to the contact does not contact the peripheral portion of the contact pad or the ceramic material.

11. A ceramic circuit structure as recited in claim 10 wherein the ring of dielectric material is formed of glass.

12. A ceramic circuit structure as recited in claim 9 wherein the barrier cap is configured to prevent the first electrically conductive material within the through-hole from chemically reacting with the second electrically conductive material forming the contact pad.

13. A ceramic circuit structure as recited in claim 9 wherein the ceramic circuit structure is mounted onto a printed circuit board, and wherein the first ceramic layer of the plurality of ceramic layers is directly adjacent to the printed circuit board.

14. A ceramic circuit structure as recited in claim 9 wherein the first electrically conductive material filling the through-hole is palladium-silver, the second electrically conductive material forming the contact pad is platinum-gold, and the third electrically conductive material forming the barrier cap is gold.

15. A ceramic circuit structure as recited in claim 9, further comprising:
a solder ball formed within the dielectric ring.

16. A ceramic circuit structure having a plurality of ceramic layers, wherein a first one of the ceramic layers comprises:
a through-hole that passes through the first ceramic layer, the through-hole being filled with a first electrically conductive material, which forms a via;
a contact pad formed on a surface of the first ceramic layer, the contact pad formed from a second electrically conductive material that is different from the first electrically conductive material; and
a dielectric ring covering a peripheral portion of the contact pad and an adjacent portion of the dielectric material layer surface immediately surrounding the contact pad, such that any solder that is applied to the contact does not contact the peripheral portion of the contact pad or the ceramic material, and such that the dielectric ring does not cover any other contact pad, wherein the ring of dielectric material is partially embedded within the surface of the first ceramic layer.

17. A ceramic circuit structure as recited in claim 16 wherein the ring of dielectric material is formed of glass.

18. A ceramic circuit structure as recited in claim 16 wherein the ceramic circuit structure is mounted onto a printed circuit board, and wherein the first ceramic layer of the plurality of ceramic layers is directly adjacent to the printed circuit board.

19. A ceramic circuit structure as recited in claim 16 wherein the contact pad is embedded within the surface of the first ceramic layer such that a surface of the contact pad is flush with the surface of the first ceramic layer.

20. A ceramic circuit structure as recited in claim 16, further comprising:
a solder ball formed within the dielectric ring.

* * * * *

UNITED STATES PATENT AND TRADEMARK OFFICE
CERTIFICATE OF CORRECTION

PATENT NO. : 6,800,815 B1
DATED : October 5, 2004
INVENTOR(S) : Ehlert et al.

It is certified that error appears in the above-identified patent and that said Letters Patent is hereby corrected as shown below:

Column 3,
Line 58, change "and toe portion" to -- and the portion --.

Signed and Sealed this

Fifth Day of April, 2005

JON W. DUDAS
*Director of the United States Patent and Trademark Office*